(12) United States Patent
Silverbrook

(10) Patent No.: US 7,285,437 B2
(45) Date of Patent: *Oct. 23, 2007

(54) METHOD OF SEPARATING MEMS DEVICES FROM A COMPOSITE STRUCTURE

(75) Inventor: Kia Silverbrook, Balmain (AU)

(73) Assignee: Silverbrook Research Pty Ltd, Balmain, New South Wales (AU)

( * ) Notice: Subject to any disclaimer, the term of this patent is extended or adjusted under 35 U.S.C. 154(b) by 7 days.

This patent is subject to a terminal disclaimer.

(21) Appl. No.: 11/273,271

(22) Filed: Oct. 28, 2005

(65) Prior Publication Data

US 2006/0051935 A1 Mar. 9, 2006

Related U.S. Application Data

(63) Continuation of application No. 10/986,354, filed on Nov. 12, 2004, now Pat. No. 6,982,184, which is a continuation of application No. 10/258,517, filed as application No. PCT/AU01/00502 on May 2, 2001, now Pat. No. 6,846,692.

(51) Int. Cl.
*H01L 21/00* (2006.01)

(52) U.S. Cl. .................... 438/51; 438/21; 438/113; 438/458; 438/464

(58) Field of Classification Search ............ None
See application file for complete search history.

(56) References Cited

U.S. PATENT DOCUMENTS

| | | | |
|---|---|---|---|
| 4,822,755 A | 4/1989 | Hawkins et al. | |
| 5,187,007 A | 2/1993 | Ebe et al. | |
| 5,476,566 A | 12/1995 | Cavasin | |
| 5,605,489 A | 2/1997 | Gale et al. | |
| 5,622,900 A | 4/1997 | Smith | |
| 5,824,177 A * | 10/1998 | Yoshihara et al. | .......... 156/250 |
| 5,904,546 A | 5/1999 | Wood et al. | |
| 5,923,599 A | 7/1999 | Kao et al. | |
| 5,923,995 A | 7/1999 | Kao et al. | |

(Continued)

FOREIGN PATENT DOCUMENTS

DE 19957111 A1 5/2000

(Continued)

OTHER PUBLICATIONS

Toshiyoshi, H et al. "Chip Level Three-Dimensional Assembling of Microsystems" Proceedings of the SPIE, Design, Test and Microfabrication of MEMS and MOEMS, Mar. 30-Apr. 1, 1999, Paris, France, vol. 3680, No. Part ½, 1999, pp. 679-686, XP001058963 Bellingham, VA, US. ISSN: 0277-786X Section "2.2 Fabrication Process"p. 680; figures 2,3.

*Primary Examiner*—Mary Wilczewski
*Assistant Examiner*—Khanh Duong

(57) ABSTRACT

A method of separating MEMS devices from a structure having a substrate, a sacrificial layer positioned on a front side of the substrate and a plurality of MEMS devices embedded in the sacrificial layer includes the step of securing a front handle wafer to the sacrificial layer. The substrate is etched from a back side to the sacrificial layer to define individual MEMS integrated circuits held together with the sacrificial layer. The front handle wafer is removed and the sacrificial layer is etched away to release the MEMS integrated circuits.

8 Claims, 5 Drawing Sheets

U.S. PATENT DOCUMENTS

| | | |
|---|---|---|
| 5,972,781 A | 10/1999 | Wegleiter et al. |
| 6,010,782 A | 1/2000 | Uemura et al. |
| 6,025,251 A | 2/2000 | Jakowetz |
| 6,184,109 B1 | 2/2001 | Sasaki et al. |
| 6,245,593 B1 | 6/2001 | Yoshihara et al. |
| 6,297,131 B1 | 10/2001 | Yamada et al. |
| 6,320,266 B1 | 11/2001 | Hatchard et al. |
| 6,383,833 B1 * | 5/2002 | Silverbrook ............ 438/51 |
| 6,425,971 B1 | 7/2002 | Silverbrook |
| 6,492,195 B2 | 12/2002 | Nakanishi et al. |
| 6,982,184 B2 * | 1/2006 | Silverbrook ............ 438/51 |
| 7,063,993 B1 * | 6/2006 | Silverbrook ............ 438/21 |

FOREIGN PATENT DOCUMENTS

| | | |
|---|---|---|
| EP | 0661737 A | 7/1995 |
| JP | 07022358 A | 1/1995 |
| JP | 08250454 A | 9/1996 |
| JP | 08281954 A | 10/1996 |
| WO | WO 01/43169 A | 6/2001 |
| WO | WO 2001/85600 | 11/2001 |

* cited by examiner

US 7,285,437 B2

METHOD OF SEPARATING MEMS DEVICES FROM A COMPOSITE STRUCTURE

CROSS-REFERENCE TO RELATED APPLICATIONS

This is a Continuation Application of U.S. application Ser. No. 10/986,354 filed on Nov. 12, 2004 now U.S. Pat. No. 6,982,184, which is a Continuation Application of U.S. application Ser. No. 10/258,517, filed on Oct. 25, 2002, now issued U.S. Pat. No. 6,846,692, which is a 371 of PCT/AU01/00502, filed on May 2, 2001.

FIELD OF THE INVENTION

This invention relates to the fabrication of devices incorporating micro-electromechanical systems (MEMS). More particularly, the invention relates to a method of fabricating MEMS devices using UV curable tapes. For the sake of brevity, such a device shall be referred to below as a MEMS device and the part of the device comprising the micro-electromechanical system shall be referred to as a MEMS layer.

SUMMARY OF THE INVENTION

According to the invention, there is provided a method of fabricating MEMS devices, the method including the steps of:-
 providing a substrate with a MEMS layer arranged on one side of the substrate;
 applying a first holding means to the MEMS layer;
 performing at least one operation on the substrate from a side of the substrate opposed to the side having the MEMS layer;
 applying a second holding means to said opposed side of the substrate;
 removing the first holding means;
 performing at least one deep silicon etch on the MEMS layer to define individual MEMS chips, each chip being composed of a part of the substrate and at least one part of the MEMS layer; and
 causing the individual chips to be released from the second holding means for removal from the second holding means.

Preferably, the method includes bonding the first holding means to the substrate. Optionally, a handling means may be applied to the first holding means. The handling means may impart rigidity to the holding means and may facilitate manipulation of a laminate, the laminate comprising the substrate and the MEMS layer.

The operations performed on the substrate may include at least one of thinning the substrate and etching the substrate from the opposed side of the substrate to divide the substrate into individual chips.

Further, the operations performed on the MEMS layer may consist of removing sacrificial material from the layer to release individual MEMS chips. The MEMS chip may comprise a part of the substrate and at least one MEMS element or component.

In a preferred embodiment of the invention, the method may include applying the second holding means to the substrate before removal of the first holding means.

The second holding means may also be bonded to the substrate. Both the first holding means and the second holding means may be in the form of tapes which have adhesives which are curable by exposure to ultraviolet (UV) light. By "curable" is meant that the adhesive loses its adhesive properties when exposed to UV light. Thus, the method may include exposing localised regions of the second holding means to the UV light to release one MEMS chip at a time from the second holding means to enable each MEMS chip to be removed individually from the second holding means.

Optionally, the method may include applying a handling means to the second holding means. The handling means may be transparent to the UV light so that the UV light is transmitted through the handling means to cure the adhesive of the second holding means.

Each handling means may be in the form of a glass, quartz, alumina or equivalent wafer.

The method may finally include removing each chip from the second holding means by a transporting means.

BRIEF DESCRIPTION OF THE DRAWINGS

The invention is now described by way of example with reference to the accompanying diagrammatic drawings in which:-

DETAILED DESCRIPTION OF THE INVENTION

Figure 1:
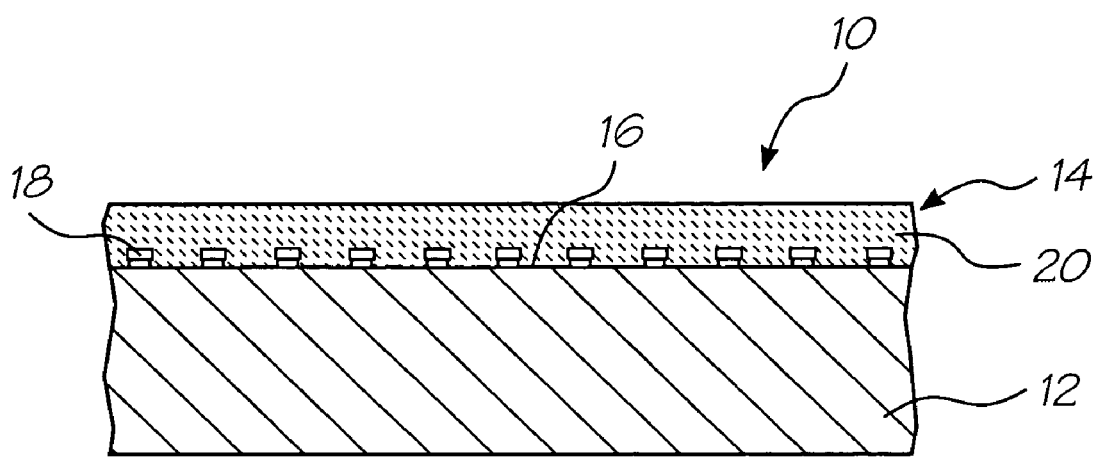
FIGS. 1 to 10 show various stages in a method of fabricating MEMS devices, in accordance with the invention.

In an initial step, illustrated at 10 in FIG. 1 of the drawings, of a method of fabricating a MEMS device, in accordance with the invention, a silicon substrate or wafer 12 is provided. The wafer 12 carries a surface micromachined MEMS layer 14 on a first surface to form a MEMS side 16 of the wafer 12.

The MEMS layer 14 has a plurality of MEMS elements or chips 18 interposed in one or more sacrificial layers 20.

Figure 2:
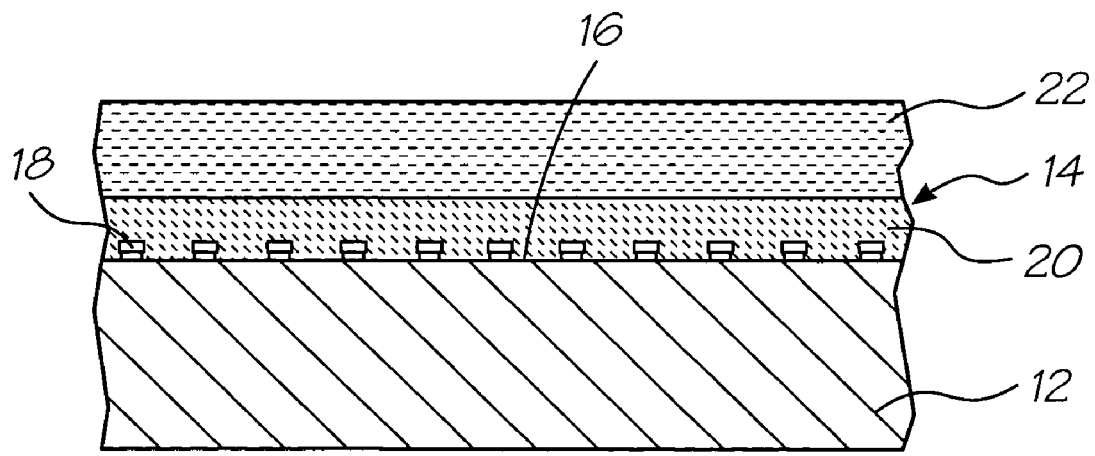
Figure 3:
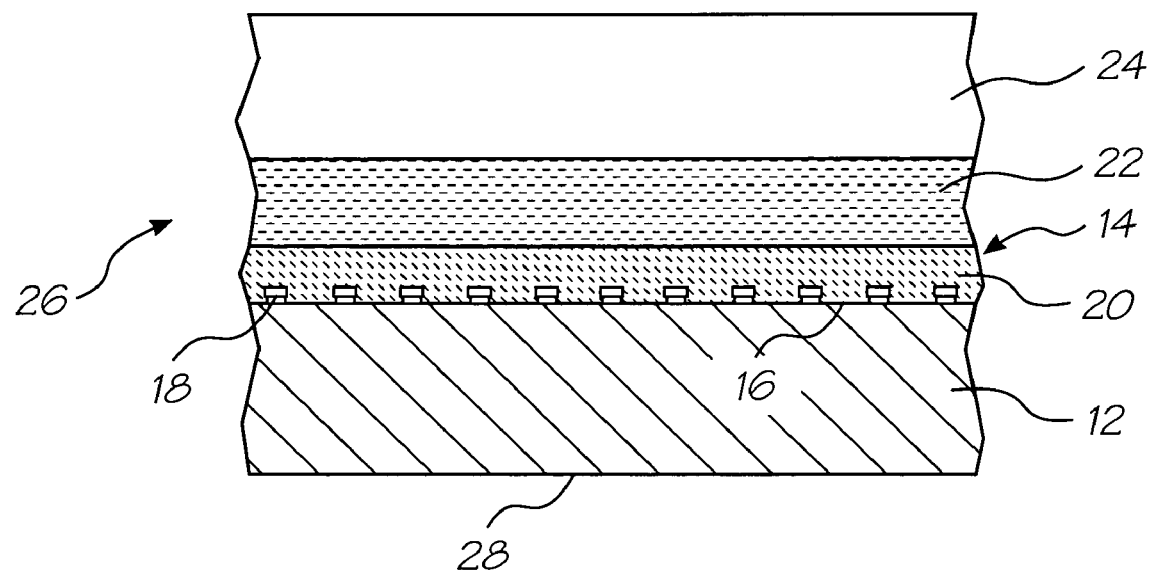

A first holding means, in the form of an adhesive tape 22, is bonded to the MEMS layer 14 as illustrated in FIG. 2 of the drawings. The tape 22 is bonded to the layer 14 by means of a curable adhesive. The adhesive is curable in the sense that it loses its adhesive properties or "tackiness" when exposed to ultraviolet (UV) light.

Depending on the equipment used, a handling means in the form of a glass, quartz, alumina or other transparent handle wafer 24 is secured to the tape 22.

A laminate 26, comprising the silicon wafer 12, the MEMS layer 14, the tape 22 and the glass wafer 24 is then turned over to expose an opposed side 28 of the silicon wafer 12.

Figure 4:
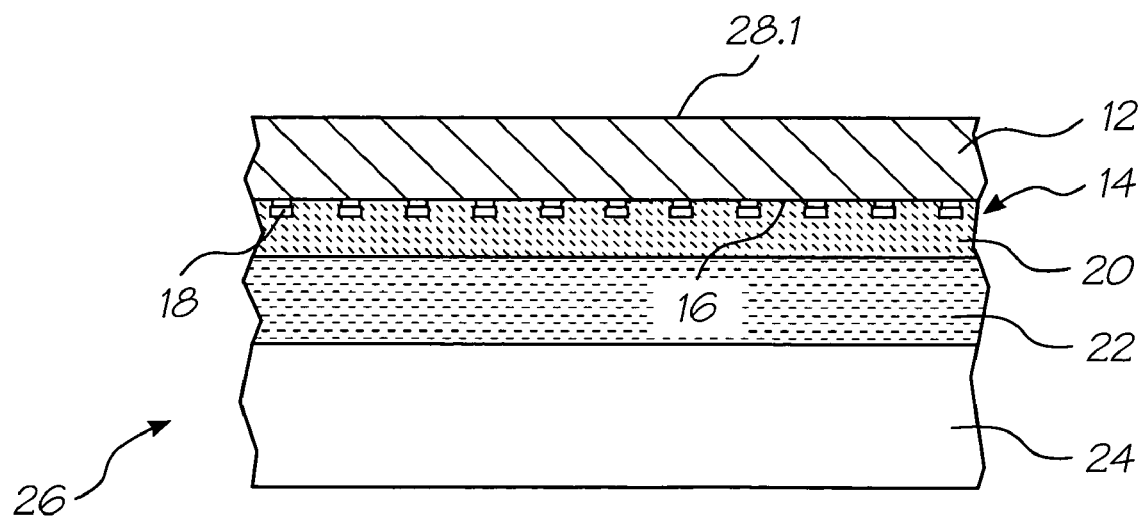

A first operation is performed on the silicon wafer 12 by back grinding a surface 28.1 of the opposed side 28 of the silicon wafer 12 to thin the wafer 12 as illustrated in FIG. 4 of the drawings. This reduces the etch time of the silicon wafer 12.

Figure 5:
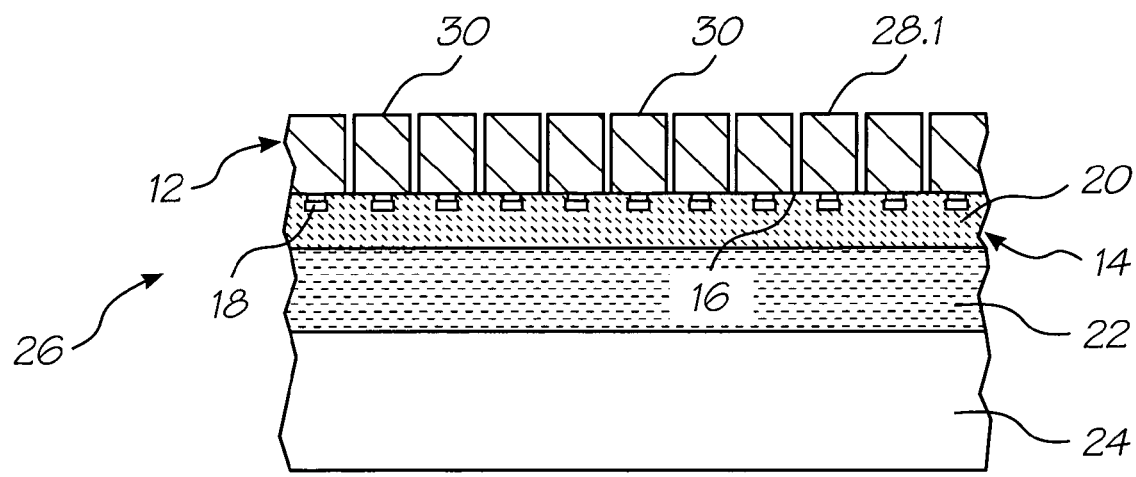
Figure 6:
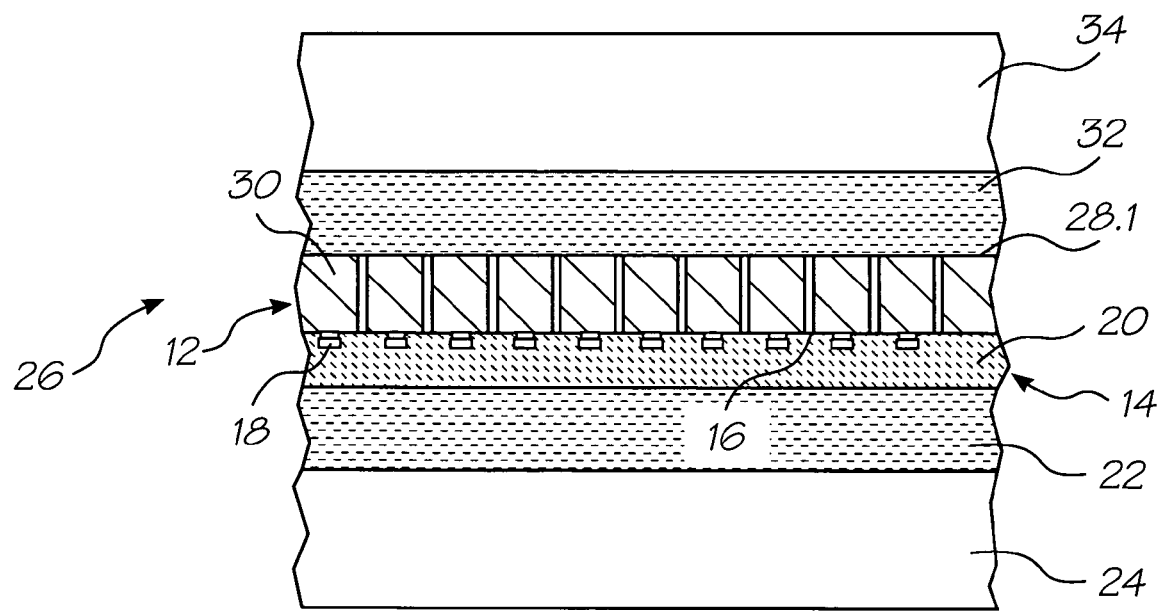

Then, as shown in FIG. 5 of the drawings, the silicon wafer 12 is deep silicon etched right through the wafer from the reverse side of the wafer to dice the wafer 12 to form individual chips 30. In this figure, each chip 30 has one MEMS element 18 associated with it but it will be appreciated that each chip 30 could, if desired, contain an array of MEMS elements.

A second holding means in the form of a second tape 32 is applied to the surface 28.1 of the silicon wafer 12. Once again, optionally, a second transparent handle wafer 34 is applied to the tape 32, depending on the equipment being used. The tape 32 is bonded to the surface 28.1 of the wafer 12 by means of an adhesive which is also curable when exposed to UV light.

Figure 7:
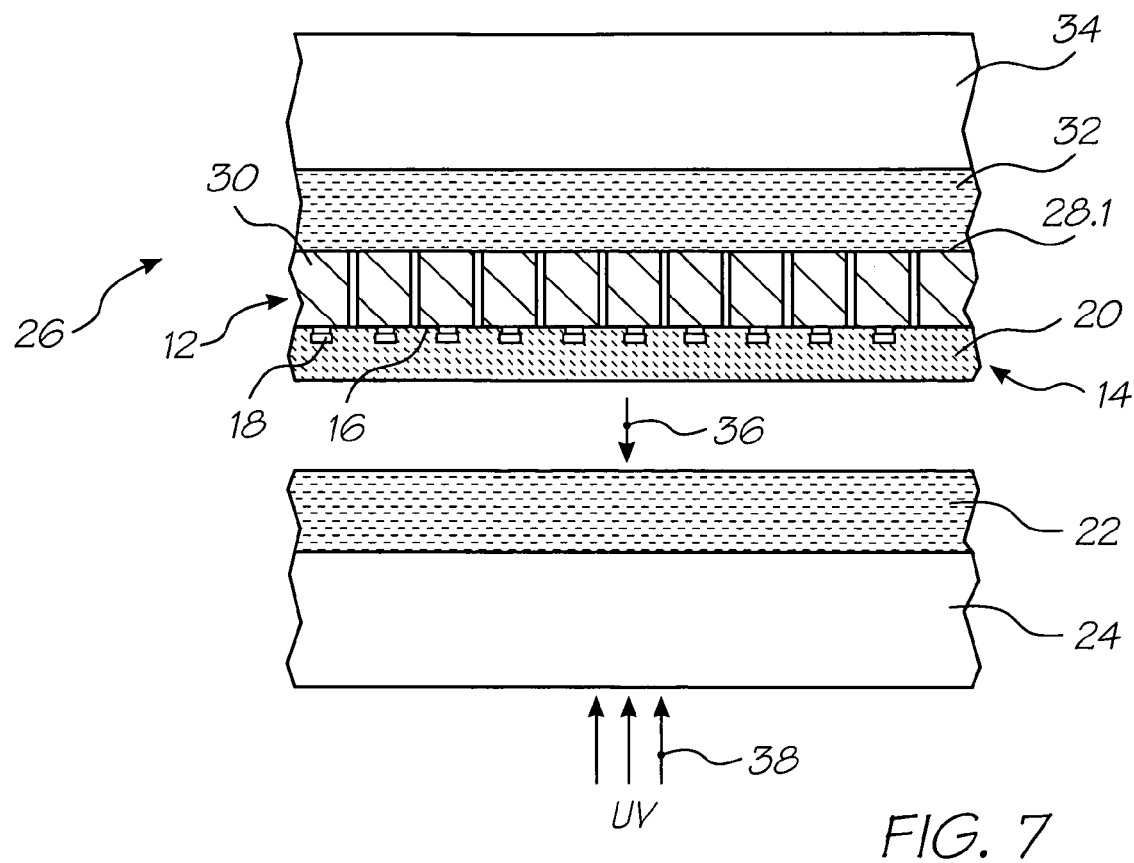
Figure 8:
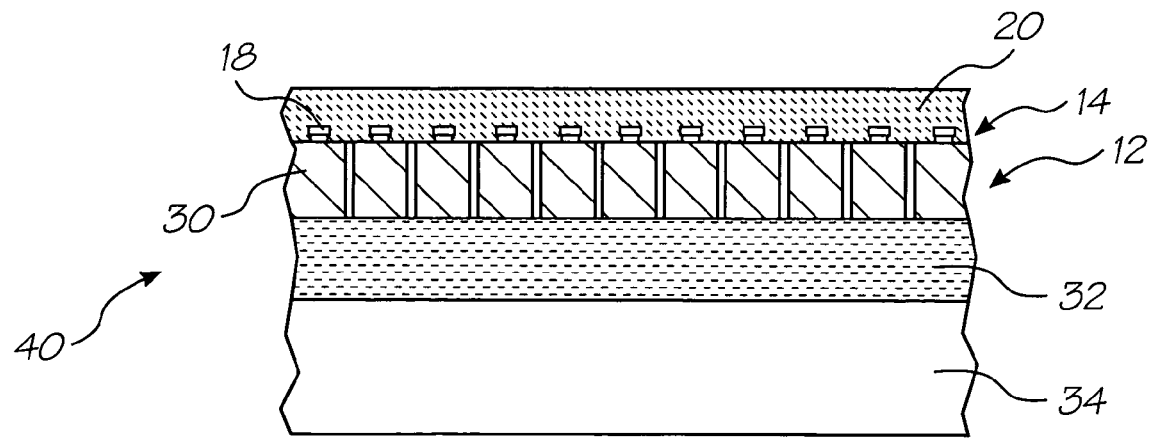
Figure 9:
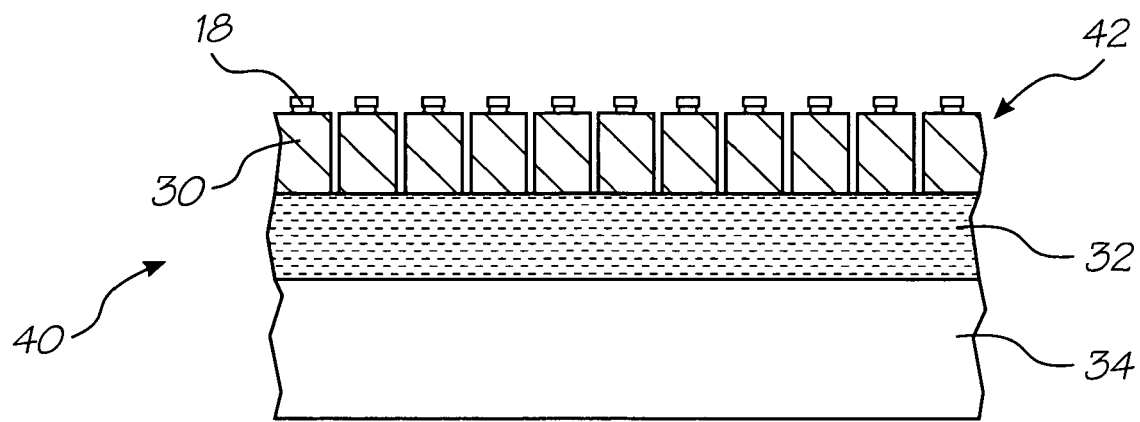

The first tape 22 and the glass wafer 24 are removed, as illustrated schematically by arrow 36 in FIG. 7 of the drawings, after application of the tape 32. The tape 22 is removed by exposing it to UV light which is projected on to the tape 22 through the glass layer 24 as illustrated by arrows 38. It will be appreciated that the glass wafer 24 is transparent to the UV light. In contrast, the silicon wafer 12 is opaque to the UV light so that the tape 32 on the other side of the wafer 12 is not affected by the UV light when the tape 22 is exposed to the UV light Once the tape 22 and glass wafer 24 have been removed, a new laminate 40, comprising the silicon wafer 12, the MEMS layer 14, the tape 32 and the glass wafer 34 is turned over to expose the sacrificial layer 20 of the MEMS layer 14.

Figure 10:
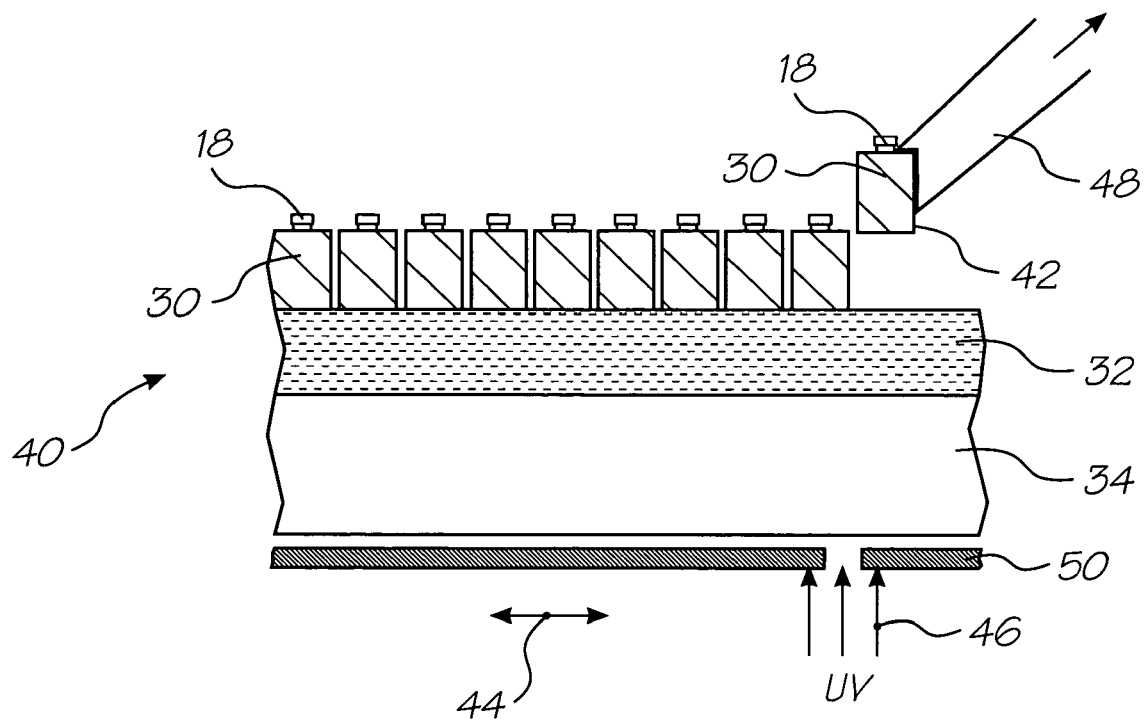

The sacrificial layer 20 is then removed by etching or by oxygen plasma techniques. This releases the MEMS elements 18, and completes the separation of the chips 42. The laminate 40 is placed on an xy wafer stage (not shown) which is reciprocated, as illustrated by arrow 44 in FIG. 10 of the drawings. Each MEMS chip 42, when it is desired to remove it, is exposed to UV light as indicated by arrows 46 through a mask 50. This cures the adhesive of the tape 32 locally beneath one particular MEMS chip 42 at a time, to enable that MEMS chip 42 to be removed from the tape 32 by means of a transporting means which may include a vacuum pickup 48.

An example of the application of the invention, is in the fabrication of inkjet printheads. In this example, the MEMS elements 18 comprise nozzle assemblies. Each assembly comprises an ink ejection nozzle and an actuator for controlling ink ejection.

Hence, it is an advantage of the invention, that a method of fabrication is provided which facilitates the performing of various operations to fabricate the individual MEMS chips and which facilitates removal of the MEMS chips 42 for packaging.

The manufacturing process facilitates that the MEMS devices 18 are not touched by solids or liquids after they are released by the release etch.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

The invention claimed is:

1. A method of separating MEMS devices from a structure having a substrate, a sacrificial layer positioned on a front side of the substrate and a plurality of MEMS devices embedded in the sacrificial layer, the method comprising the steps of:
   securing a front handle wafer to the sacrificial layer;
   etching the substrate from a back side to the sacrificial layer to define one of an individual MEMS integrated circuits and an array of MEMS integrated circuits held together with the sacrificial layer;
   removing the front handle wafer; and
   etching away the sacrificial layer to release the MEMS integrated circuits.

2. A method as claimed in claim 1, in which the step of securing the front handle wafer to the sacrificial layer includes the step of bonding an adhesive tape to the sacrificial layer and securing the front handle wafer to the adhesive tape.

3. A method as claimed in claim 2, in which the step of bonding the adhesive tape to the sacrificial layer is carried out using a UV-degradable adhesive.

4. A method as claimed in claim 1, which includes the step of securing a back handle wafer to the back side of the substrate subsequent to etching the substrate from the back side.

5. A method as claimed in claim 4, in which the step of securing the back handle wafer to the substrate includes the step of bonding an adhesive tape to the back side of the substrate and securing the back handle wafer to the adhesive tape.

6. A method as claimed in claim 5, in which the step of bonding the adhesive tape to the back side of the substrate is carried out using a UV-degradable adhesive.

7. A method as claimed in claim 1, in which the step of etching the substrate from the back side comprises the step of performing at least one deep silicon etch on the back side.

8. A method as claimed in claim 5, which includes the step of thinning the substrate from the back side prior to etching the wafer.

* * * * *